United States Patent
Kim

(10) Patent No.: US 6,864,173 B2
(45) Date of Patent: Mar. 8, 2005

(54) METHOD FOR FORMING BIT LINES OF SEMICONDUCTOR DEVICE

(75) Inventor: Jong Hwan Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/616,823

(22) Filed: Jul. 10, 2003

(65) Prior Publication Data

US 2004/0121574 A1 Jun. 24, 2004

(30) Foreign Application Priority Data

Dec. 21, 2002 (KR) ................................ 10-2002-0082172

(51) Int. Cl.[7] .............................................. H01L 21/44
(52) U.S. Cl. ...................... 438/675; 438/674; 438/299; 438/303; 438/637
(58) Field of Search ................................ 438/674–675, 438/299, 303, 637

(56) References Cited

U.S. PATENT DOCUMENTS

| | | |
|---|---|---|
| 5,362,666 A | 11/1994 | Dennison |
| 5,946,568 A | 8/1999 | Hsiao et al. |
| 6,037,216 A | 3/2000 | Liu et al. |
| 6,177,320 B1 | 1/2001 | Cho et al. |
| 6,177,340 B1 | 1/2001 | Yoo et al. |
| 6,251,726 B1 * | 6/2001 | Huang .......................... 438/253 |
| 6,271,125 B1 * | 8/2001 | Yoo et al. .................... 438/637 |
| 6,348,411 B1 | 2/2002 | Ireland et al. |
| 6,417,055 B2 | 7/2002 | Jang et al. |

* cited by examiner

*Primary Examiner*—Luan Thai
(74) *Attorney, Agent, or Firm*—Ladas & Parry LLP

(57) ABSTRACT

Disclosed is a method for forming bit lines of a semiconductor device capable of solving an issue on overlay between a bit line contact and a bit line when bit lines of DRAM are formed. The method comprises the steps of preparing a semiconductor substrate where active areas and device isolation areas are defined, forming a device isolation layer on the device isolation areas, forming a plurality of word lines on the substrate at a constant interval; forming source/drain dopant areas on the active areas on both sides of each word line, forming landing plugs contacting with the source/drain dopant areas in a matrix form, forming first, second and third insulation layers in sequence on a front surface of the substrate including the word lines, defining areas for bit lines through alternative etching of the second and second insulation layers, forming bit line contact holes through alternative etching of the first insulation layer so as to alternatively expose the landing plugs, and forming bit lines within the bit line areas including the bit line contact holes.

8 Claims, 11 Drawing Sheets

METHOD FOR FORMING BIT LINES OF SEMICONDUCTOR DEVICE

BACKGROUND OF THE INVENTION

1. Field of the Invention

The present invention relates to a method for forming bit lines of a semiconductor device, a method capable of solving a problem of overlay between a bit line contact and a bit line when bit lines of DRAM are formed.

2. Description of the Prior Art

FIGS. 1a to 1d are cross-sectional views showing a method for forming bit lines of a semiconductor device according to the prior art.

As shown in FIG. 1a, in the conventional method for forming bit lines of a semiconductor device, each device isolation area (not shown) of a semiconductor substrate 10 is alternatively etched to form a trench (not shown). The trench is embedded with an oxide layer, so that a device isolation layer 11 is formed.

Subsequently, a plurality of word lines 15 are formed at a constant interval on the substrate 10 including the device isolation layer 11, wherein each word line 15 includes a gate insulation layer 12, a gate electrode 13 and a hard mask 14. Then, dopants for LDD (Lightly Doped Drain) are implanted on the front surface of the substrate using the word lines 15 as a mask. Each word line 15 has sidewalls, each of which is formed with a second insulation layer spacer 16. Here, the hard mask 14 makes use of silicon nitride as its own material. Subsequently, active areas of the semiconductor substrate 10 are formed with LDD and source/drain dopant areas (not shown) using the word lines 15 and second insulation layer spacers 16 as a mask by means of the ion implantation of implanting dopants on the front surface of the substrate.

As shown in FIG. 1b, a first inter-insulation layer 17 is formed on the resultant front surface of the substrate. This first inter-insulation layer is flattened by CMP (Chemical Mechanical Polishing) until a surface of the hard mask 14 is exposed. Then, the first inter-insulation layer at which the flattening process is finished is alternatively etched to partially expose the dopant areas, and thereby a plurality of landing plug contacts (LPCs) 18 are formed.

Next, as shown in FIG. 1c, the front surface of the substrate including the LPCs 18 is deposited with a first polysilicon layer (not shown), and then is subjected to CMP, and a plurality of landing plug 19 for embedding the LPCs 18 are formed. The resultant upper portion is provided with a second inter-insulation layer 20. A photosensitive layer pattern 21 is formed on the second inter-insulation layer 20, where areas for the bit line contacts are defined on the photosensitive layer pattern 21. Here, the photosensitive layer pattern 21 is prepared larger than an actual size of the bit line contacts in consideration of a property of exposure equipment, and then a photosensitive layer reflow process is performed to reduce the size of the bit line contacts (not shown).

Subsequently, the second inter-insulation layer 20 is etched to expose the landing plugs 19 using the photosensitive layer pattern 21 as a mask, and thereby the bit line contacts 22 are formed.

As shown in FIG. 1d, after the photosensitive layer pattern is removed, a metallic layer 23 is formed on the front surface of the substrate including the bit line contacts 22 by means of a sputtering process.

Then, even if not shown in the drawings, the metallic layer is alternatively etched to form the landing plugs and the bit lines.

However, the foregoing convention method for forming bit lines of a semiconductor device has problems as follows.

In the case that the bit line contacts are misaligned with the bit lines, the bit lines fail to cover the bit line contacts in place. Thus, when storage node contacts are formed in the subsequent process, bridges are generated. Further, during an etching process of the bit lines, etching damage is delivered to the active areas along the bit line contacts, so that a junction property is deteriorated in the device.

Meanwhile, when the bit line contact holes are defined in a large size, the bit line contact holes incur a short with the storage node contacts in the subsequent process, and misalignment between the bit line contacts and the landing plug contacts is generated. In addition, there is a problem in that, as the bit lines are recently formed to have a thin bit line structure in which each bit line is of 0.1 microns or less, the bit lines are not defined correctly by scattered reflection at overlapping areas of the bit line contacts, so that bit line bridges are generated.

SUMMARY OF THE INVENTION

Accordingly, the present invention has been made to solve the above-mentioned problems occurring in the prior art, and an object of the present invention is to provide a method for forming bit lines of a semiconductor device, in which bit lines are formed through a Damascene process, and bit line contacts are formed in a self-aligned contact mode after an etching process of the bit lines, and thereby misalignment between the bit line contacts and the bit lines can be prevented.

In order to accomplish this object, there is provided a method for forming bit lines of a semiconductor device, comprising the steps of: preparing a semiconductor substrate where active areas and device isolation areas are defined; forming a device isolation layer on the device isolation areas; forming a plurality of word lines on the substrate at constant intervals; forming source/drain dopant areas on the active areas on both sides of each word line; forming landing plugs contacting with the source/drain dopant areas in a matrix form; forming first, second and third insulation layers in sequence on a front surface of the substrate including the word lines; defining areas for bit lines through alternative etching of the second and second insulation layers; forming bit line contact holes through alternative etching of the first insulation layer so as to alternatively expose the landing plugs; and forming bit lines within the bit line areas including the bit line contact holes.

It is preferred that the word lines each include a gate insulation layer, a gate electrode and a hard mask, the gate electrode being made of either a combination of polysilicon and tungsten-silicide, or metal.

Further, it is preferred that the step of defining the bit line areas further comprises the sub-steps of: depositing photoresist on the third insulation layer and alternatively patterning the photoresist using exposure and development processes; defining the bit line areas through alternative etching of the third insulation layer using the patterned photoresist as a mask and removing the patterned photoresist; and alternatively etching the second insulation layer using the third insulation layer as a mask.

It is preferred that the second insulation layer is any one of an HTO (High Temperature Oxide) layer and a silicon-nitride layer, and the third insulation layer makes use of a material having an etching ratio different from that of the second insulation layer.

It is preferred that the second insulation layer is made of BPSG (Boro-Phosphor-Silicate Glass).

Further, the bit line contact holes are preferably formed in a self-align contact mode.

In addition, the bit lines are made of any one of a combination of polysilicon with tungsten-silicide or another metallic substance.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
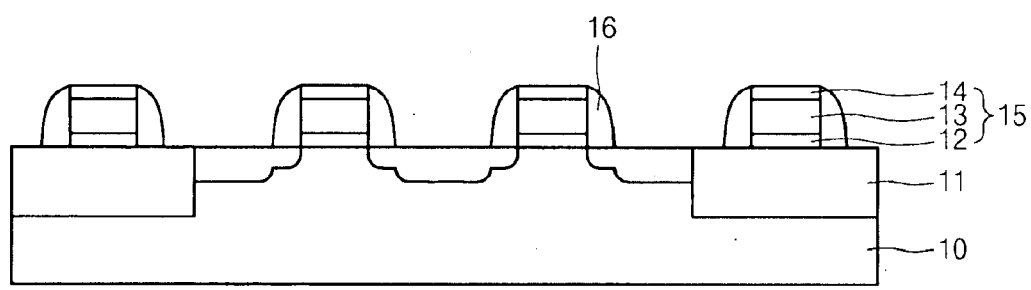
FIGS. 1a to 1d are cross-section views illustrating a method for forming bit lines of a semiconductor device according to the prior art.
Figure 1B:
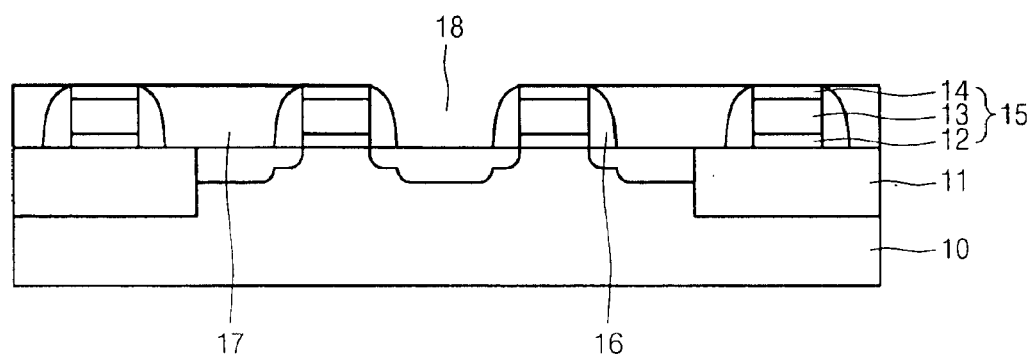
Figure 1C:
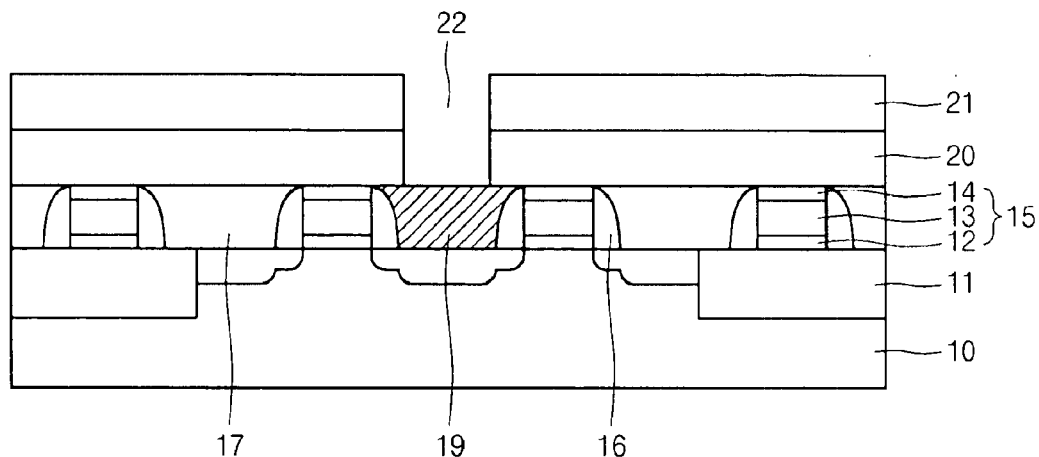
Figure 1D:
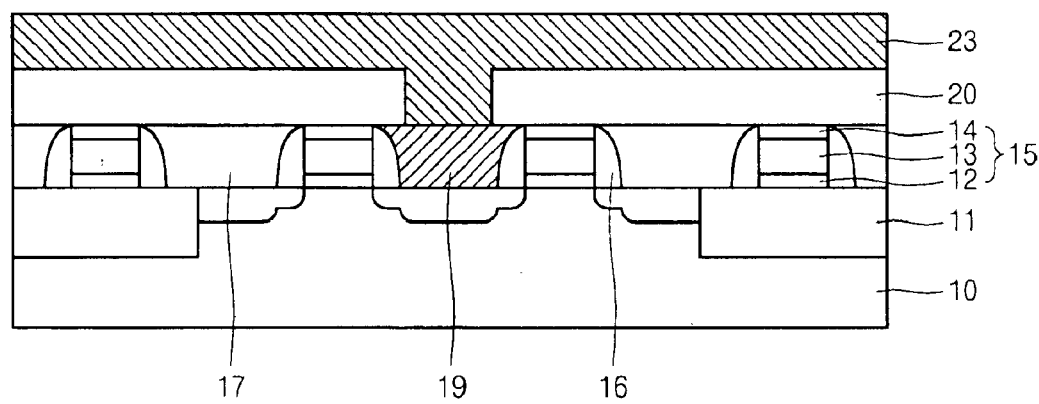

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2a to 2f are layout diagrams sequentially showing a method for forming bit lines of a semiconductor device according to the present invention. FIGS. 3a to 3f are cross-sectional views taken along the line X—X of FIG. 2. FIGS. 4a to 4f are cross-sectional views taken along the line Y—Y of FIG. 2.

Figure 2A:
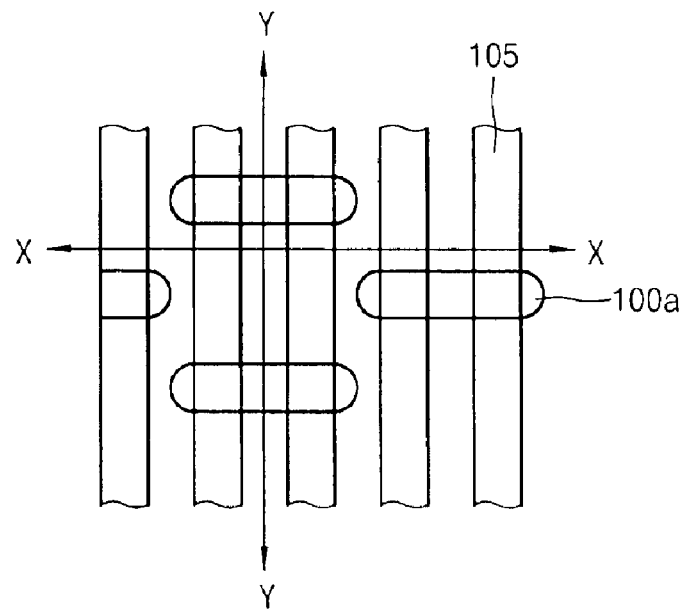
FIGS. 2a to 2f are layout diagrams sequentially showing a method for forming bit lines of a semiconductor device according to the present invention.
Figure 3A:
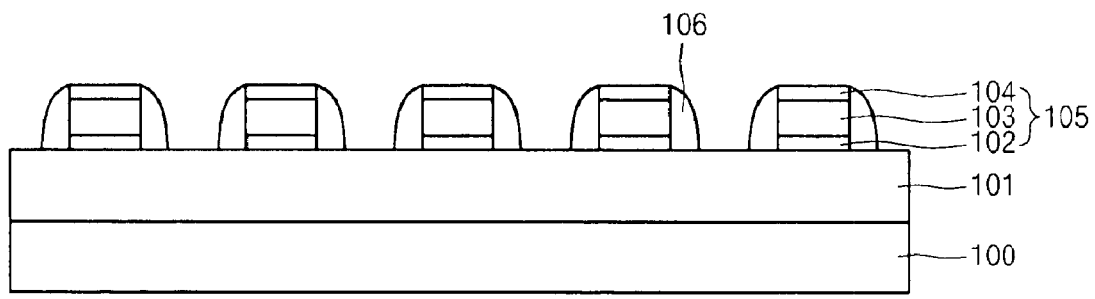
FIGS. 3a to 3f are cross-sectional views taken along the line X—X of FIG. 2.
Figure 4A:
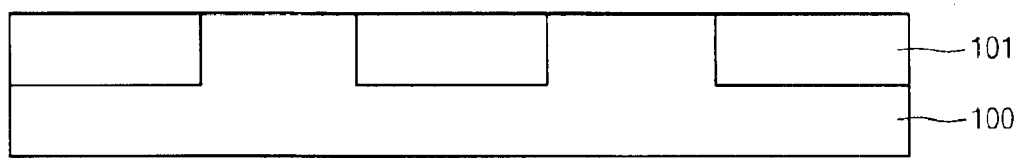
FIGS. 4a to 4f are cross-sectional views taken along the line Y—Y of FIG. 2.

As shown in FIGS. 2a, 3a and 4a, the method for forming bit lines of a semiconductor device according to the present invention, first, prepares a semiconductor substrate 100 in which active areas 100a and device isolation areas (not shown) are defined. Each device isolation area of the substrate 100 formed with a trench (not shown). These trenches are embedded with an oxide layer, so that a device isolation layer 101 is formed. Then, a plurality of word lines 105 are formed at a constant interval on the substrate 100 including the device isolation layer 101, wherein each word line 15 includes a gate insulation layer 102, a gate electrode 103 and a hard mask 104. Each of the word lines 105 has sidewalls, each of which is provided with a spacer 106. Subsequently, each active area of the semiconductor substrate 100 is provided with a source/drain dopant area (not shown) through the ion implantation for implanting dopants using the word lines 105 and the spacers 106 as a mask. Here, the gate electrode 103 is made of a combination of a polycrystalline silicon layer and a tungsten-silicide layer, or a tungsten layer.

Figure 2B:
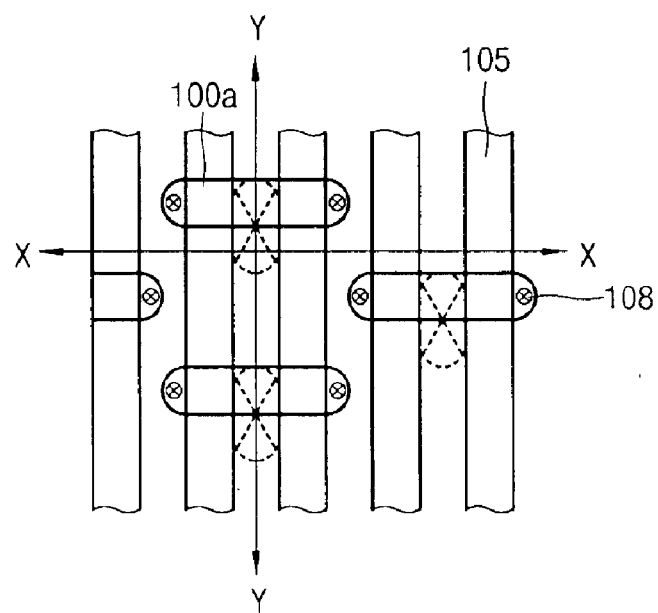
Figure 3B:
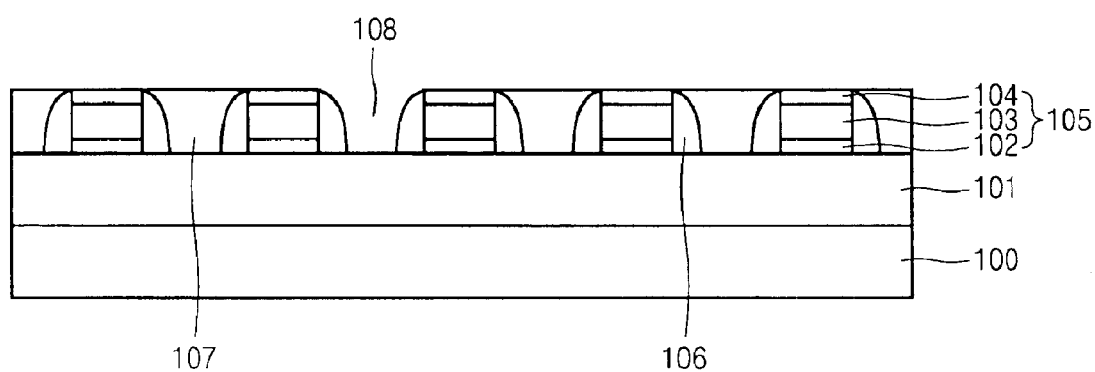
Figure 4B:
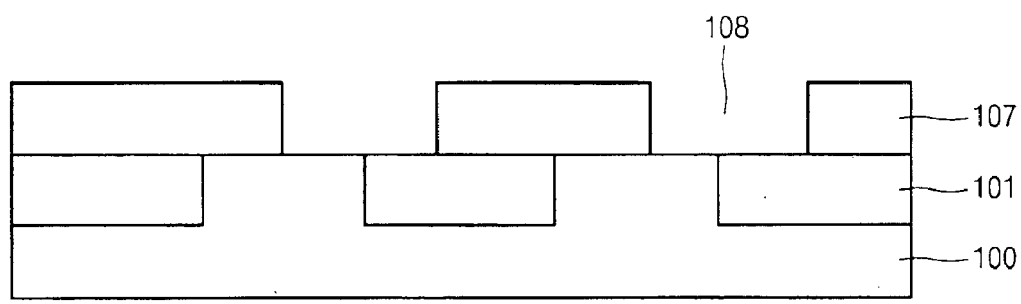

As shown in FIGS. 2b, 3b and 4b, a first inter-insulation layer 107 is formed on the front surface of the resultant structure. The first inter-insulation layer 107 is flattened by CMP (Chemical Mechanical Polishing) until each surface of the hard masks 104 is exposed. Then, the first inter-insulation layer 107 is alternatively etched to expose a part of each dopant area, and thus a plurality of landing plug contacts (LPCs) 108 are formed.

Figure 2C:
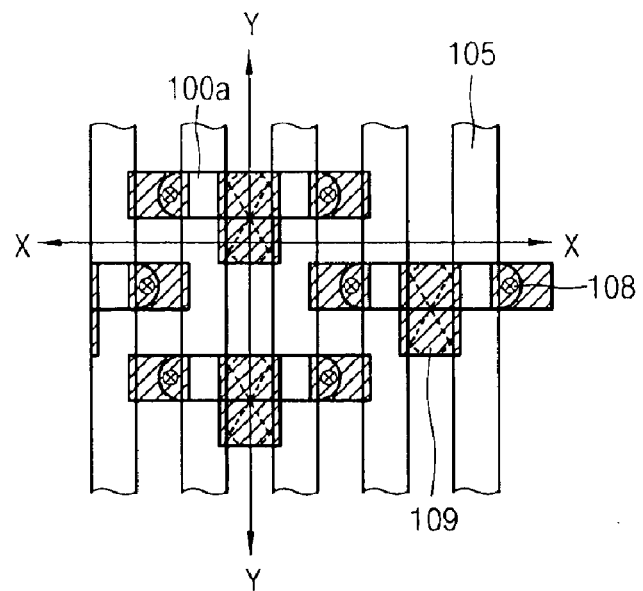
Figure 3C:
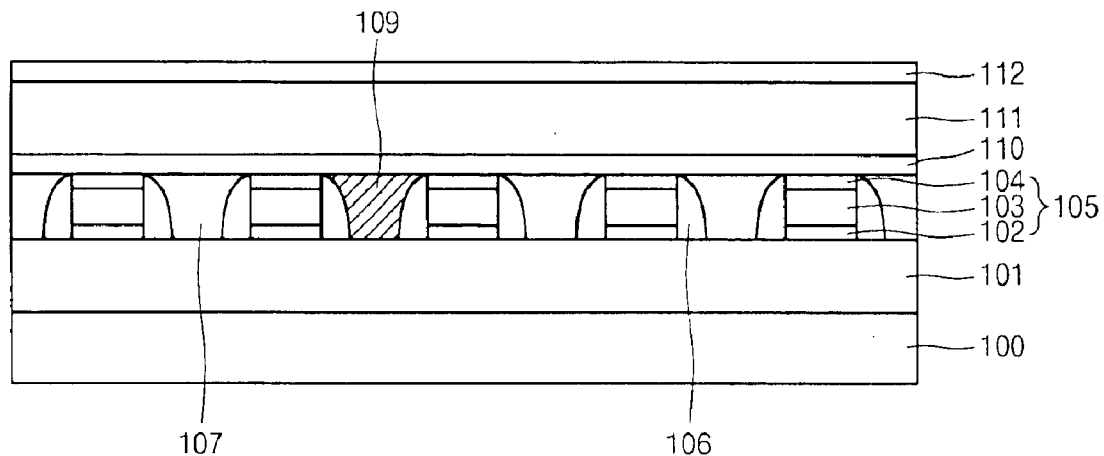
Figure 4C:
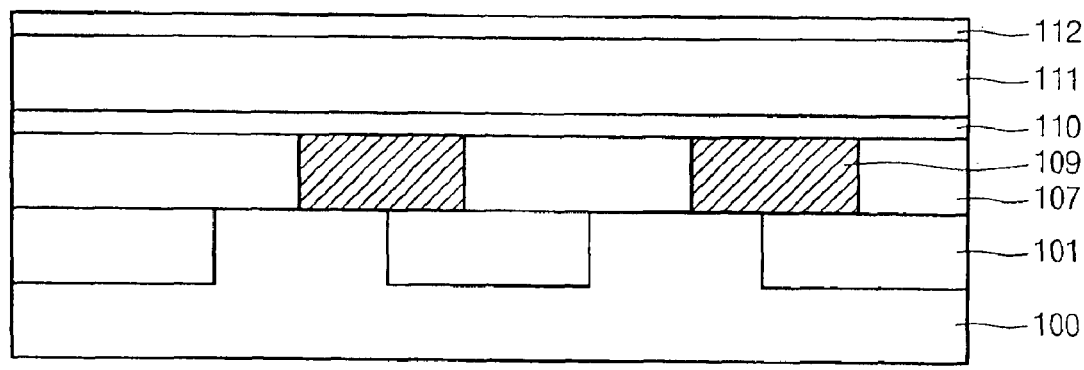

Next, as shown in FIGS. 2c, 3c and 4c, the front surface including the LPCs 108 is deposited with a first polycrystalline silicon layer (not shown), and after CMP is carried out, a plurality of landing plugs 109 for embedding the LPCs 108 are formed. The resultant upper portion is sequentially formed with second and third inter-insulation layers 110 and 111. Here, the second inter-insulation layer 110, for example, is comprised of either an HTO (High Temperature Oxide) layer or a silicon nitride layer. The third inter-insulation layer 111 makes use of any one of BPSG (Boro-Phosphor-Silicate Glass) and TEOS (Tetra-Ethyl-Ortho-Silicate), both of which are a material having an etching ratio different from that of the second inter-insulation layer 110.

Subsequently, a silicon nitride layer 112 also to be referred to as a fourth inter-insulation layer is formed on the third inter-insulation layer 111.

Figure 2D:
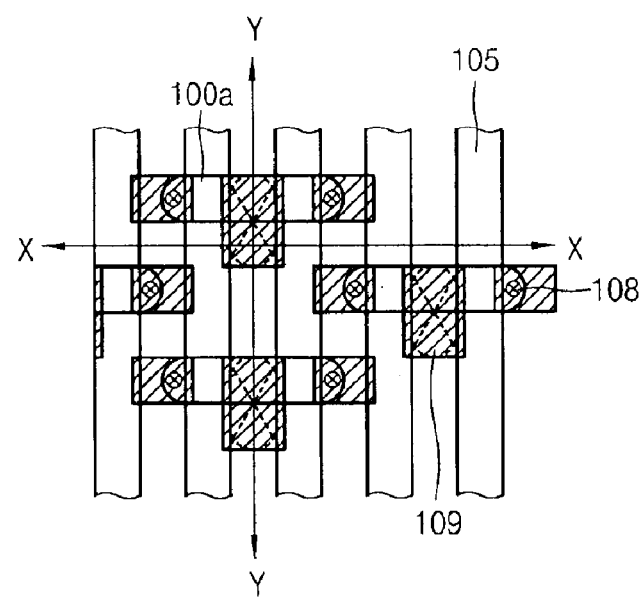
Figure 3D:
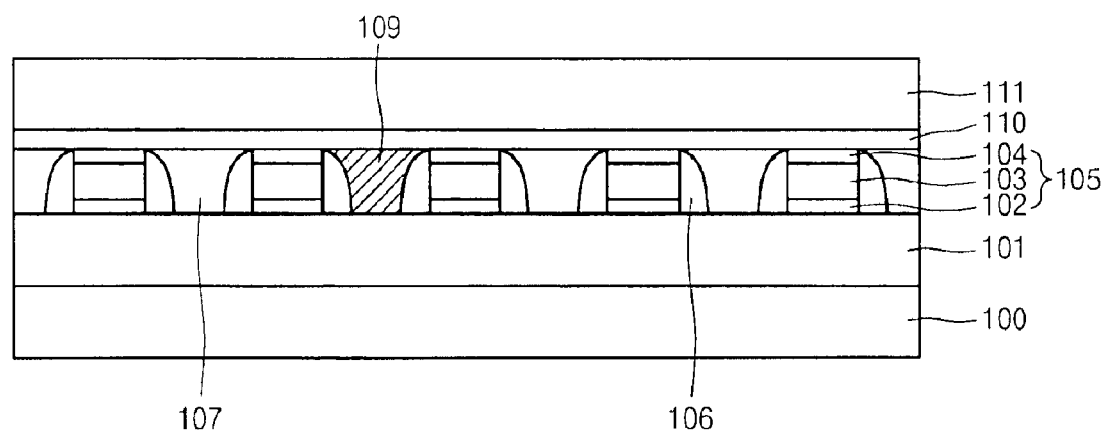
Figure 4D:
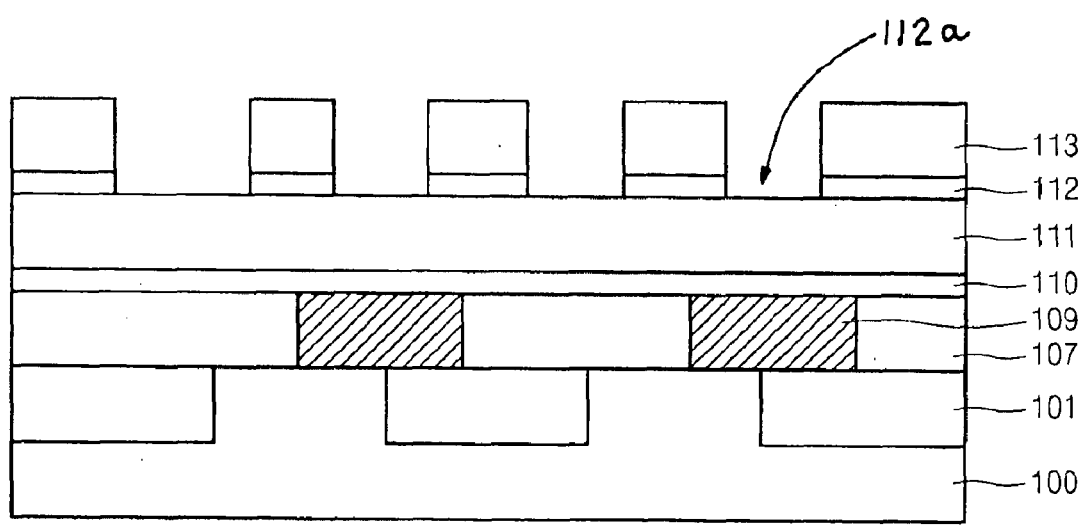

As shown in FIGS. 2d, 3d and 4d, a photosensitive layer pattern 113 is formed on the silicon nitride layer (a.k.a., the fourth inter-insulation layer) 112, in which bit line contact areas are defined on the photosensitive layer pattern 113. Subsequently, the silicon nitride layer (a.k.a., the fourth inter-insulation layer) 112 is etched to form a silicon nitride layer pattern (also to be referred to as a fourth inter-insulation layer pattern) 112a using the photosensitive layer pattern 113 as a mask as shown in FIG. 4D.

Figure 2E:
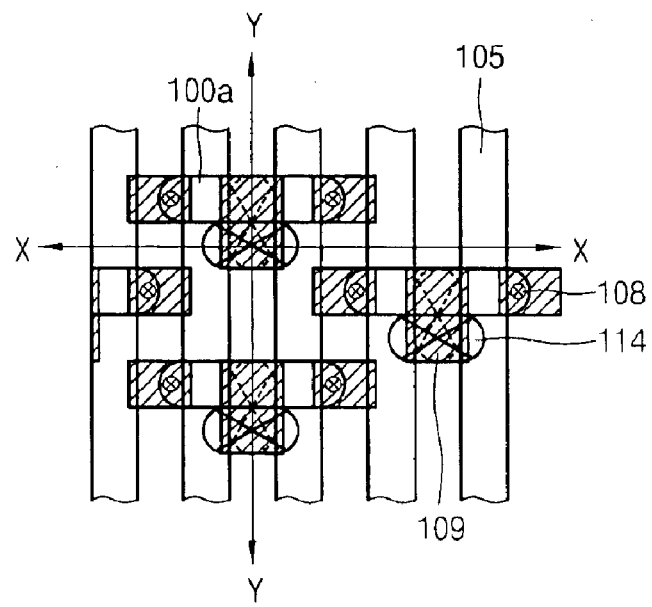
Figure 3E:
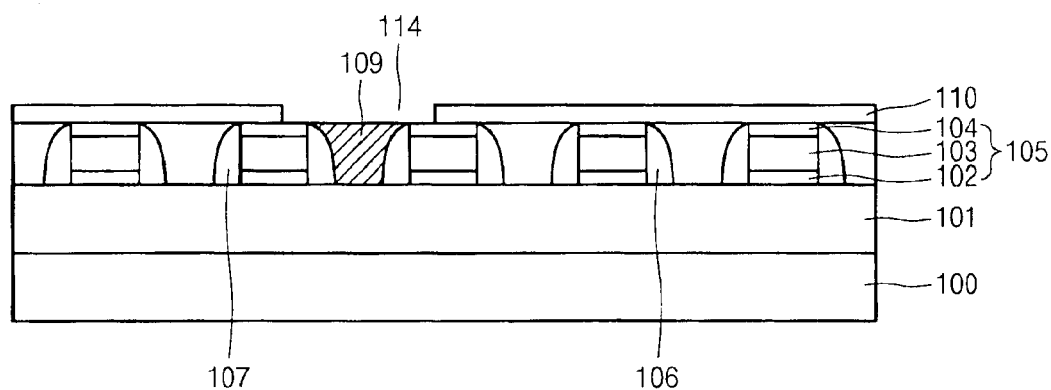
Figure 4E:
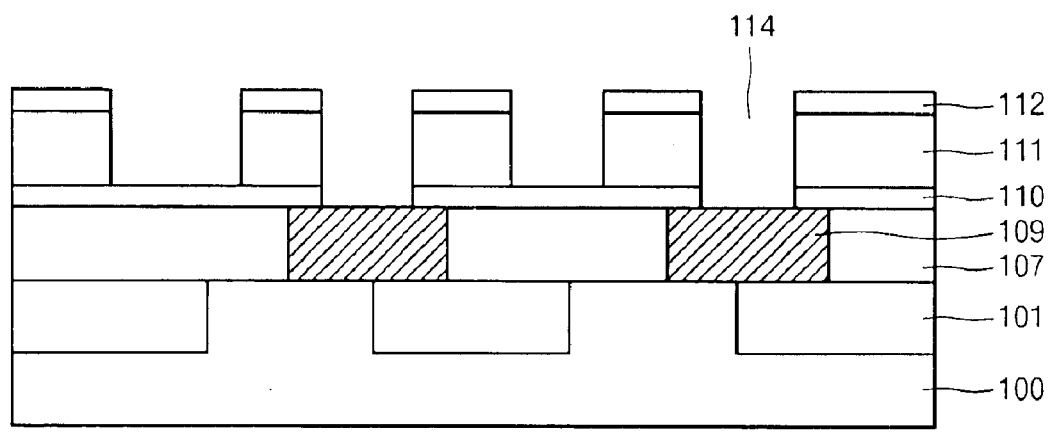

As shown in FIGS. 2e, 3e and 4e, the photosensitive layer pattern is removed, and then the third and second inter-insulation layers 111 and 110 are etched to form bit line contacts 114 using the silicon nitride layer pattern (a.k.a., a fourth inter-insulation layer pattern) 112a as a mask. Here, the bit line contacts 114 are applied by a self-aligned contact mode, so that, during the process of etching the bit line contacts, each bit line contact is formed only on the inside of each bit line defined in a Damascene process, but not on the outside of each bit line.

Figure 2F:
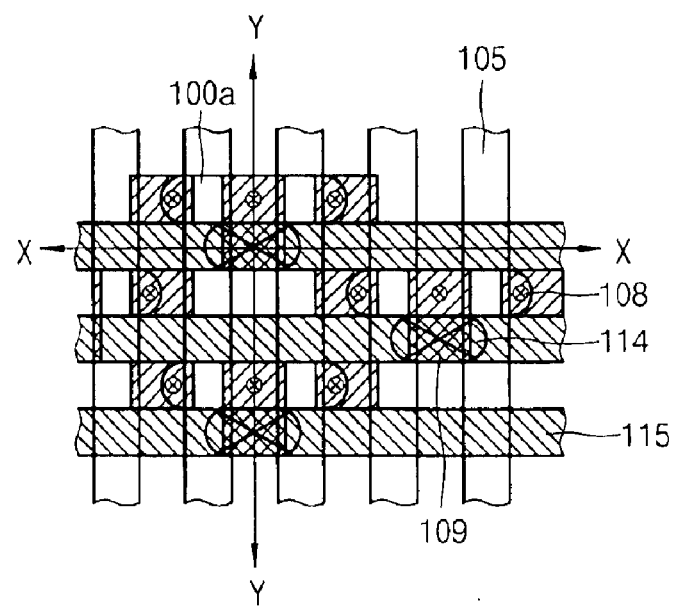
Figure 3F:
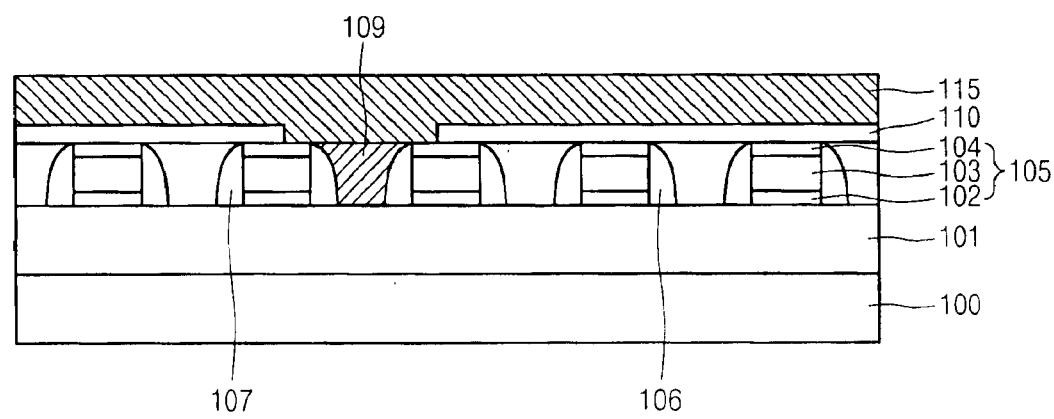
Figure 4F:
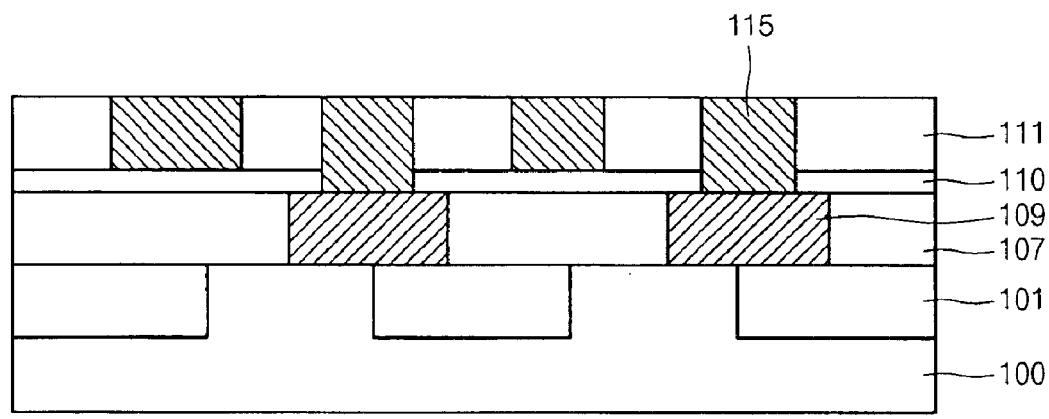

As shown in FIGS. 2f, 3f and 4f, the front surface of the substrate including the bit line contacts 114 is formed with a conductive layer (not shown), which consists of either a combination of a polycrystalline silicon layer and tungsten silicide layer, or a metallic layer 23. Here, even if not shown in the drawings, a barrier metallic layer is intervened between the bit line contacts and the conductive layer.

A fourth silicon nitride layer pattern and the conductive layer are subjected to CMP until a surface of the second inter-insulation layer is exposed, and thereby bit lines 115 having a Damascene structure are formed, in which the bit lines 115 are connected with the landing plugs 109.

Even if not shown in the drawings, a fifth inter-insulation layer is formed on the resultant structure. The fifth inter-insulation layer is alternatively etched to form storage node contacts. The storage node contacts are formed with insulation spacers, so that a short between the bit lines and the storage node contacts is prevented.

In the present invention, the bit line contacts are formed in a self-aligned contact mode. As a result, as shown in FIG. 2f, the outer portions of the bit lines are not etched by the silicon nitride layer pattern (a.k.a. the fourth inter-insulation layer pattern) 112a, so that the bit line contacts 114 can be broadly formed in a direction in which the bit lines are to be formed. That is, even though the bit line contacts 114 have a sufficiently large size, they are not formed on the outer portions of the bit lines. Thus, it is easy to fabricate the photosensitive layer pattern for forming the bit line contacts.

As mentioned above, according to a method of bit lines of a semiconductor device of the present invention, the bit line contacts are formed in a self-aligned contact mode, so that the bit line contacts can be formed on the inside of the areas where the bit lines are to be formed. Therefore, a problem of overlay between contact holes for the bit lines and the bit lines can be fully solved. Further, there is no fear for a short between the bit line contacts and the storage node contacts.

Further, the bit line contacts are formed after areas to form the bit lines are patterned by the silicon nitride pattern first, so that in the process of masking the bit lines, it is possible to prevent a bridge between the bit lines from being generated by scattered reflection at the bit line contacts.

The bit line contacts can be formed in a sufficiently large size along the bit lines, so that it is possible to improve a resistance of the bit line contacts.

Meanwhile, even if the bit line contacts have an increased size, the bit line contacts can be formed only in the areas where the bit lines are formed. Thus, it is possible to increase the size of the bit line contacts on the photosensitive layer pattern. Consequently, there is no necessity to use a process such as the photosensitive layer reflow process.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming bit lines, each bit line having a width, of a semiconductor device, comprising the steps of:

forming a plurality of word lines and dopant areas on a semiconductor substrate;

forming a first inter-insulation layer on the substrate including the word lines, the first inter-insulation layer including landing plug contacts exposing a part of each dopant area;

forming landing plugs for embedding the landing plug contacts;

forming second and third inter-insulation layers in that order on a front surface of the substrate including the landing plugs;

forming a fourth mask pattern by a Damacene process on the third inter-insulation layer, wherein the mask pattern defines etching areas at least substantially along the width of each to-be-formed bit line;

forming bit line contacts for exposing the landing plugs by etching the third and second inter-insulation layers according to the fourth mask pattern, wherein each bit line contact is formed within the width of the bit line; and forming bit lines for embedding the bit line contacts.

2. A method as claimed in claim 1, wherein the word lines each include a gate insulation layer, a gate electrode and a hard mask, the gate electrode having a structure of any one of a combination of polycrystalline silicon layer and a tungsten suicide layer, and a tungsten layer.

3. A method as claimed in claim 1, wherein the step of forming a fourth mask pattern comprises the sub-steps of:

forming a fourth inter-insulation layer on the third inter-insulation layer;

forming photosensitive layer pattern on the fourth inter-insulation layer, areas for the bit line contacts being defined on the photosensitive layer pattern;

forming the fourth mask pattern by etching the fourth inter-insulation layer using the photosensitive layer pattern as a mask; and removing the photosensitive layer pattern.

4. A method as claimed in claim 1 or 3, wherein the third inter-insulation layer makes use of any one of a HTO (High Temperature Oxide) layer and a silicon-nitride layer, and the second inter-insulation layer makes use of a material having an etching ratio different from that of the second inter-insulation layer.

5. A method as claimed in claim 4, wherein the third inter-insulation layer is made of any one of BPSG (Boro-Phosphor-Silicate Glass) and TEOS (Tetra-Ethyl-Ortho-Silicate).

6. A method as claimed in claim 1, wherein the third inter-insulation layer is made of any one of BPSG (Boro-Phosphor-Silicate Glass) and TEOS (Tetra-Ethyl-Ortho-Silicate).

7. A method as claimed in claim 1, wherein the bit line contact holes are formed in a self-align contact mode, wherein during an etching process, the etching area for each bit line contact is defined entirely within a bit line by the fourth mask pattern.

8. A method as claimed in claim 1, wherein the bit lines are of any one of a combination of polysilicon with tungsten-silicide, and a metallic substance.

* * * * *